US008289051B2

United States Patent
Turner et al.

(10) Patent No.: US 8,289,051 B2
(45) Date of Patent: Oct. 16, 2012

(54) INPUT/OUTPUT CORE DESIGN AND METHOD OF MANUFACTURE THEREFOR

(75) Inventors: Mark F. Turner, Longmont, CO (US); Jeff S. Brown, Fort Collins, CO (US); Paul Dorweiler, Windsor, CO (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/947,948

(22) Filed: Nov. 17, 2010

(65) Prior Publication Data

US 2012/0119785 A1    May 17, 2012

(51) Int. Cl.
H03K 19/177    (2006.01)
H01L 25/00    (2006.01)
(52) U.S. Cl. .................. 326/101; 326/39; 326/47
(58) Field of Classification Search .............. 326/37–41, 326/47, 101
See application file for complete search history.

(56) References Cited

U.S. PATENT DOCUMENTS

| | | | |
|---|---|---|---|
| 5,612,631 A * | 3/1997 | Agrawal et al. ................ 326/39 |
| 5,859,547 A | 1/1999 | Tran et al. | |
| 5,982,193 A * | 11/1999 | Agrawal et al. ................ 326/39 |
| 6,218,857 B1 * | 4/2001 | Sharpe-Geisler et al. ...... 326/39 |
| 6,218,859 B1 * | 4/2001 | Pedersen ........................ 326/39 |
| 6,271,679 B1 * | 8/2001 | McClintock et al. ........... 326/38 |
| 6,489,688 B1 * | 12/2002 | Baumann et al. .............. 257/786 |
| 6,768,142 B2 * | 7/2004 | Ali et al. ........................ 257/203 |
| 6,798,069 B1 * | 9/2004 | Ali et al. ........................ 257/775 |
| 6,861,868 B1 * | 3/2005 | Agrawal et al. ................ 326/38 |
| 7,034,570 B2 * | 4/2006 | McClintock et al. ........... 326/38 |
| 7,346,876 B2 * | 3/2008 | Chan et al. ....................... 716/50 |
| 7,808,117 B2 * | 10/2010 | Vo et al. ......................... 257/786 |
| 7,969,184 B1 * | 6/2011 | Redgrave ........................ 326/38 |
| 2003/0209731 A1 * | 11/2003 | Ali et al. ........................ 257/203 |
| 2005/0169042 A1 * | 8/2005 | Miyagi .......................... 365/154 |
| 2006/0192588 A1 * | 8/2006 | Hangaishi ....................... 326/87 |

FOREIGN PATENT DOCUMENTS

WO    2007/098402 A2    8/2007

* cited by examiner

*Primary Examiner* — Shawki Ismail
*Assistant Examiner* — Thienvu Tran

(57) ABSTRACT

One aspect provides an input/output cell. The input/output cell, in one example, includes an input/output layout boundary delineated on a substrate, wherein the input/output layout boundary defines a first side parallel and opposing a second side, a third side parallel and opposing a fourth side, wherein the first and second sides are substantially perpendicular the third and fourth sides. The input/output cell, in this example, further includes input/output transistors positioned within the input/output layout boundary over the substrate. The input/output cell, in this example, further includes first and second power conductors and first and second ground conductors located over the substrate, the first power conductor and first ground conductor extending entirely between the first and second sides and the second power conductor and second ground conductor extending entirely between the third and fourth sides.

20 Claims, 5 Drawing Sheets

INPUT/OUTPUT CORE DESIGN AND METHOD OF MANUFACTURE THEREFOR

TECHNICAL FIELD

This application is directed, in general, to integrated circuit chip design, and more specifically to input/output core design, and a method of manufacture therefore.

BACKGROUND

Input/Output core (I/O) designers physically design their I/O's to pack the most connections between the IC and the package in the smallest amount of area. Over time, IC interfaces have become a limiting factor, as many packages require the chip I/O's to be surrounding the functional area of the IC along the outer edges of the die. Unfortunately, area grows faster than the length of the periphery of the die. For instance, when comparing a die that is one cm on a side to a die that is two cm on a side, the two cm die will have roughly four times the area for logic (four square centimeters versus one square centimeter) but only two times the periphery for I/O (8 cm versus 4 cm). Because of this, I/O's have tended to be physically designed tall and skinny—the narrower the better—to maximize the number of connections possible in the same amount of length along the perimeter of the die.

The tall and skinny I/O layout requires the I/O be rotated 90 degrees for placement along the sides of the die, and 180 degrees for placement along the top of the die. Of recent, however, process design rules have added constraints to the physical layout of the transistors on a die, one of which is that all transistor gates must be oriented in the same direction (e.g., vertical). It is difficult, however, to accommodate these constraints. For example, the orientation constraint can be accommodated by designing a special I/O layout for each side of the die, one that has the tall and skinny layout with the transistors similarly oriented. This is undesirable because of the time and expense required to do such. Alternatively, the orientation constraint can be accommodated by not rotating the I/O by 90 degrees along the sides of the design, thereby effectively making the I/O short and fat along the sides, and thereby reducing the number of I/O's surrounding the chip. This is undesirable for obvious reasons.

Accordingly, what is needed in the art is an I/O design that addresses the problems experienced by current I/O designs, including one that accommodates the need for symmetric transistor layout, while maintaining or even improving I/O packing density.

SUMMARY

One aspect provides an input/output cell. The input/output cell, in one example, includes an input/output layout boundary delineated on a substrate, wherein the input/output layout boundary defines a first side parallel and opposing a second side, and a third side parallel and opposing a fourth side, wherein the first and second sides are substantially perpendicular the third and fourth sides. The input/output cell, in this example, further includes input/output transistors positioned within the input/output layout boundary over the substrate. The input/output cell, in this example, further includes first and second power conductors and first and second ground conductors located over the substrate, the first power conductor and first ground conductor extending entirely between the first and second sides and the second power conductor and second ground conductor extending entirely between the third and fourth sides.

In another aspect, a method for manufacturing the aforementioned input/output cell is provided. In yet another aspect, an integrated circuit chip is provided. The integrated circuit chip, in this example, includes core logic circuitry positioned over a substrate and within a core logic layout boundary delineated on the substrate, and an array of input/output cells substantially surrounding and abutting the core logic layout boundary. In this example, each of the input/output cells includes input/output transistors oriented in a same direction as the other input/output transistors in the array. Moreover, each input/output cell in this example further includes 1) an input/output layout boundary delineated on the substrate, wherein the input/output layout boundary defines a first side parallel and opposing a second side, a third side parallel and opposing a fourth side, wherein the first and second sides are substantially perpendicular the third and fourth sides, 2) first and second power conductors located over the substrate, the first power conductor extending entirely between the first and second sides and the second power conductor extending entirely between the third and fourth sides, 3) first and second ground conductors located over the substrate, the first ground conductor extending entirely between the first and second sides and the second ground conductor extending entirely between the third and fourth sides, and 4) a bond pad located within the input/output layout boundary over the substrate.

BRIEF DESCRIPTION

Reference is now made to the following descriptions taken in conjunction with the accompanying drawings, in which.

DETAILED DESCRIPTION

The present disclosure is based in part, on the acknowledgement that by using a simple set of layout rules, a single I/O cell design can be used for all four sides of a core logic die, without violating transistor gate directionality rules, and maintaining or improving I/O cell density. With this acknowledgement, the disclosure recognizes that by making the power and ground conductors (e.g., rails) connectable on all four sides of the I/O layout boundary, the I/O cells can be stacked both vertically and horizontally. In concert with the power and ground conductors being connectable on all four sides, a pair of signal pins may be located on two perpendicular sides of the I/O layout boundary, also allowing the I/O cells to be stacked vertically and horizontally. The disclosure has also recognized that by making the bond pad layout boundary square, and in one example positioned in a corner of the I/O cell, improved I/O cell density can be obtained. Similar benefits are achieved by making the I/O layout boundary square.

Figure 1:
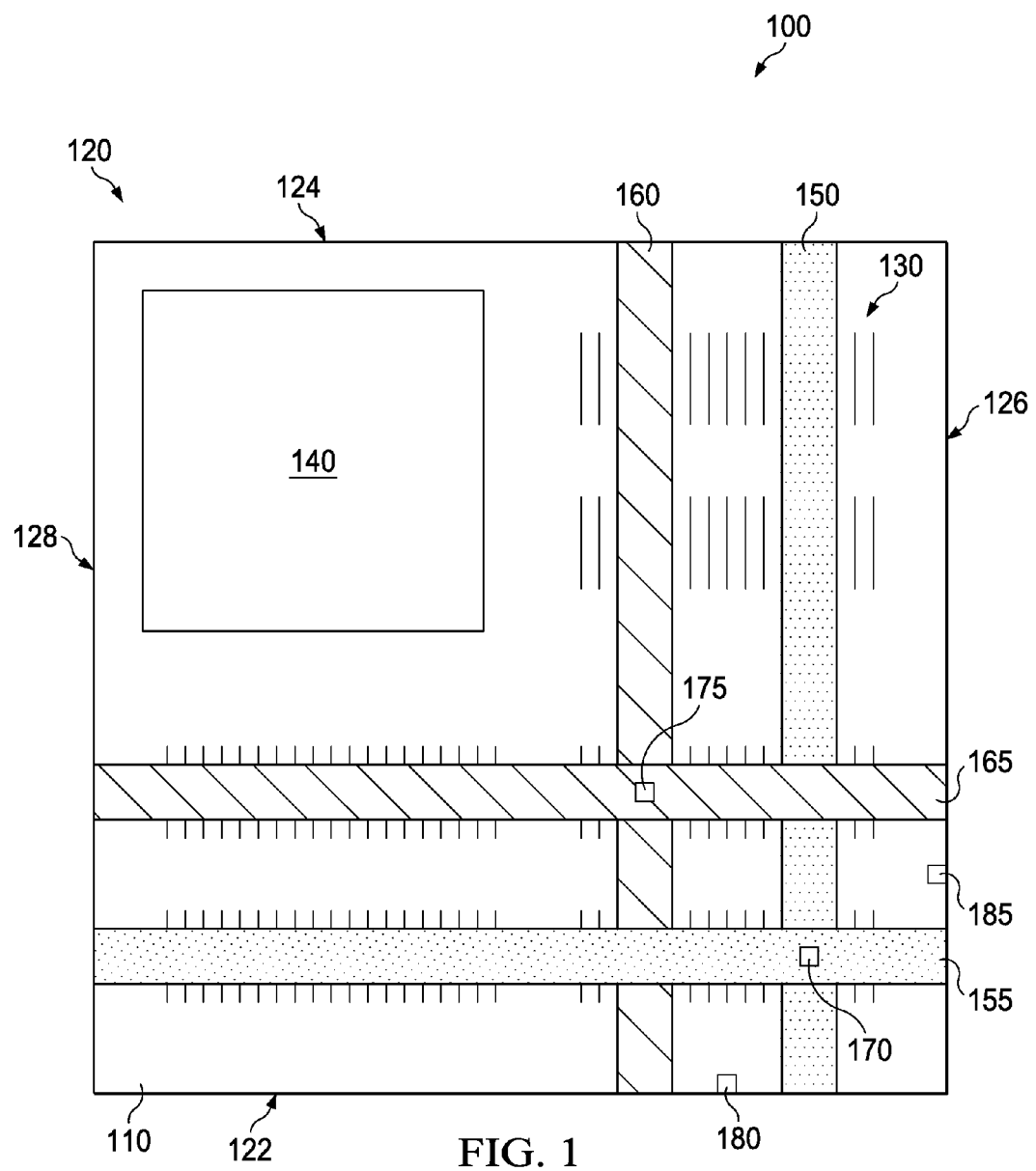
FIG. 1 illustrates an I/O cell designed and manufactured in accordance with the disclosure.

Turning to FIG. 1, illustrated is an I/O cell 100 designed and manufactured in accordance with the disclosure. The I/O cell 100 initially includes a substrate 110. The substrate 110 may be any substrate currently known or hereafter used in integrated circuits, including any substrate currently known or hereafter used in the manufacture of I/O cells.

Figure 2:
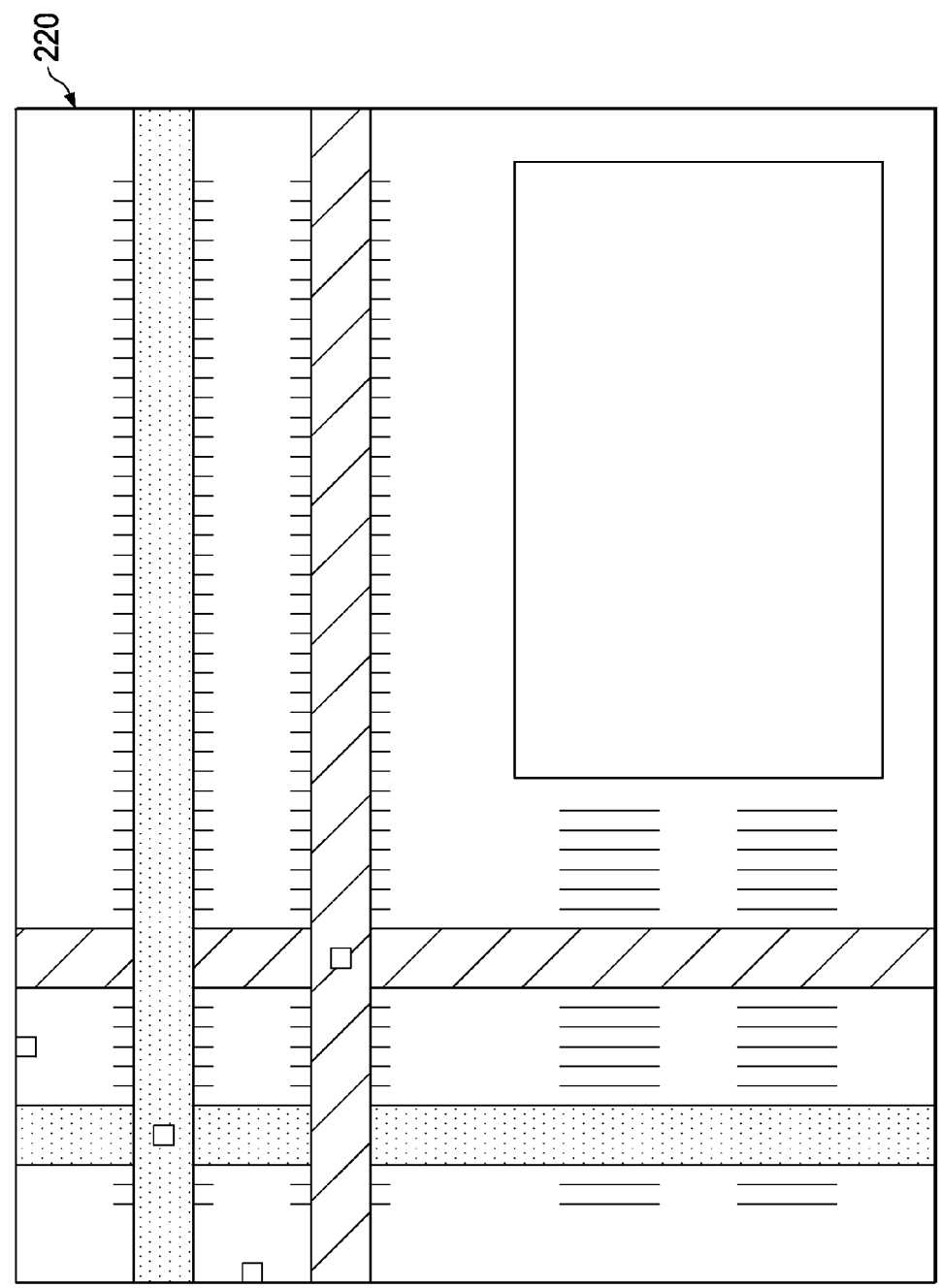
FIG. 2 illustrates an I/O cell designed and manufactured in accordance with another embodiment of the disclosure.

Delineated on the substrate 110 in the embodiment of FIG. 1 is an I/O layout boundary 120. The I/O layout boundary 120 defines a first side 122 that is parallel and opposing a second side 124, as well as a third side 126 that is parallel and apposing a fourth side 128. In the embodiment of FIG. 1, the first and second sides 122, 124 are perpendicular to the third and fourth sides 126, 128. Likewise, in the embodiment of FIG. 1, the I/O layout boundary 120 forms a square. Nevertheless, as shown in the I/O cell 200 of FIG. 2, the I/O layout boundary 220 may embrace other shapes, including that of a rectangle.

The term "I/O layout boundary" as used herein, means an actual or theoretical boundary encompassing all the features of a single, and often repeatable, I/O cell. For instance, certain embodiments exist wherein an array of I/O cells are stacked both horizontally and vertically around core logic circuitry. In this embodiment, a physical boundary between the different I/O cells may not exist, as they are all being formed on the same substrate. Notwithstanding the absence of a physical boundary, each of the different I/O cells would undoubtedly still have an I/O layout boundary.

The I/O cell 100 of FIG. 1 further includes I/O transistors 130 positioned within the I/O layout boundary 120. In the example of FIG. 1, each of the transistors 130 is oriented in the same direction. For example, each of the transistors 130 in the embodiment of FIG. 1 is oriented in a vertical direction. In accordance with known transistor gate directionality rules, the orientation of the transistors 130 in adjacent I/O cells will often repeat, for example regardless of the side of the core logic layout boundary the specific I/O cell is positioned. Stated another way, certain embodiments of the disclosure will require all I/O transistors in an entire integrated circuit (IC) chip to have the same orientation.

The I/O cell 100 of FIG. 1 further includes a bond pad 140 positioned within the I/O layout boundary 120. The bond pad 140, in the embodiment of FIG. 1, is in the shape of a square. Nevertheless, other different embodiments exist wherein other shaped bond pads may be used. Likewise, the bond pad 140 is positioned proximate a corner of the I/O layout boundary 120. As used herein, the phrase "proximate a corner of the I/O layout boundary" means that the bond pad 140 is positioned more near two perpendicular sides of the I/O layout boundary 120 than the two remaining sides. For example, in the embodiment of FIG. 1, the bond pad 140 is located proximate the corner formed by the second and fourth sides 124, 128, and thus would be distal the corner formed by the first and third sides 122, 126. As a result of the bond pad 140 being positioned proximate a corner of the I/O layout boundary 120, at least two sides of the bond pad 140 may face the I/O transistors 130. Stated another way, the I/O transistors 130 may be proximate multiple sides of the bond pad 140, as opposed to only a single side of the bond pad as used in prior art structures.

The I/O cell of FIG. 1 further includes first and second power conductors 150, 155 (e.g., rails) positioned over the substrate 110. The first and second power conductors 150, 155 in the embodiment of FIG. 1, each extend entirely between opposing sides of the I/O layout boundary 120. For instance, the first power conductor 150 might extend entirely between the first side 122 and the second side 124, and the second power conductor 155 might extend entirely between the third side 126 and the fourth side 128. The I/O cell 100 of FIG. 1 further includes first and second ground conductors 160, 165 (e.g., rails) positioned over the substrate 110. The first and second ground conductors 160, 165 in the embodiment of FIG. 1, each also extend entirely between opposing sides of the I/O layout boundary 120. For instance, the first ground conductor 160 might extend entirely between the first side 122 and the second side 124, and the second ground conductor 165 might extend entirely between the third side 126 and the fourth side 128.

In the embodiment of FIG. 1, the first power conductor 150 and first ground conductor 155 could be located on a given metal level of the I/O cell 100, wherein the second power conductor 155 and second ground conductor 165 might be located on a different metal level of the I/O cell 100. For example, the first power conductor 150 and first ground conductor 160 could be formed on metal level-3, and then the second power conductor 155 and second ground conductor 165 might be formed on subsequent metal level-4. In this configuration, vias 170, 175 could be used to interconnect the first power conductor 150 to the second power conductor 155 and the first ground conductor 160 to the second ground conductor 165, respectively.

In the embodiment of FIG. 1, the position, location and size of the first and second power and ground conductors 150, 155, 160, 165 provide for increased metal routing area. Accordingly, an I/O cell manufactured in accordance with this disclosure, such as the I/O cell 100, may experience improved current carrying capacity, as compared to its prior art counterparts.

The I/O cell 100 of FIG. 1 further includes first and second signal pins 180, 185 located over the substrate 110. In the embodiment shown, the first signal pin 180 is located proximate the first side 122 and the second signal pin 185 is located proximate the third side 126. While it is less important which side number the first and second signal pins 180, 185 are located, it is more important that the first and second signal pins 180, 185 are positioned such that regardless of whether the I/O cell 100 is being located on a horizontal side of the core logic layout boundary or a vertical size of the core logic layout boundary, at least one of the first or second signal pins 180, 185 faces the core logic layout boundary. State another way, regardless of the orientation of the I/O cell 100, at least one of the first or second signal pins 180, 185 should face the core logic circuitry. The first and second signal pins 180, 185, may be located on any layer of the I/O cell 100.

An I/O cell, such as the I/O cell 100 of FIG. 1, may be manufactured using a variety of different processes and steps. Nevertheless, in one embodiment an I/O cell, such as the I/O cell 100 of FIG. 1, could be manufactured by first providing a substrate. After providing the substrate, transistor level features, such as the transistors themselves (e.g., including source/drain features, gate oxides, and gate electrodes), could be formed in/on/over the substrate. A dielectric layer could then be formed over the transistor level features, upon which the first power conductor and first ground conductor could be formed. The first power conductor and first ground conductor, in accordance with the disclosure, would typically extend entirely between the first and second sides of the I/O layout boundary. Subsequent thereto, another dielectric layer could be formed over the first power conductor and first ground conductor. Vias could then be formed through this dielectric layer to contact the first power conductor and first ground conductor. A second power conductor and second ground conductor may then be formed on the second dielectric layer, aligned with the vias. Thereafter, the first and second signal pins could be formed. The bond pads would likely be formed in a subsequent metal level as the first and second signal pins.

Figure 3:
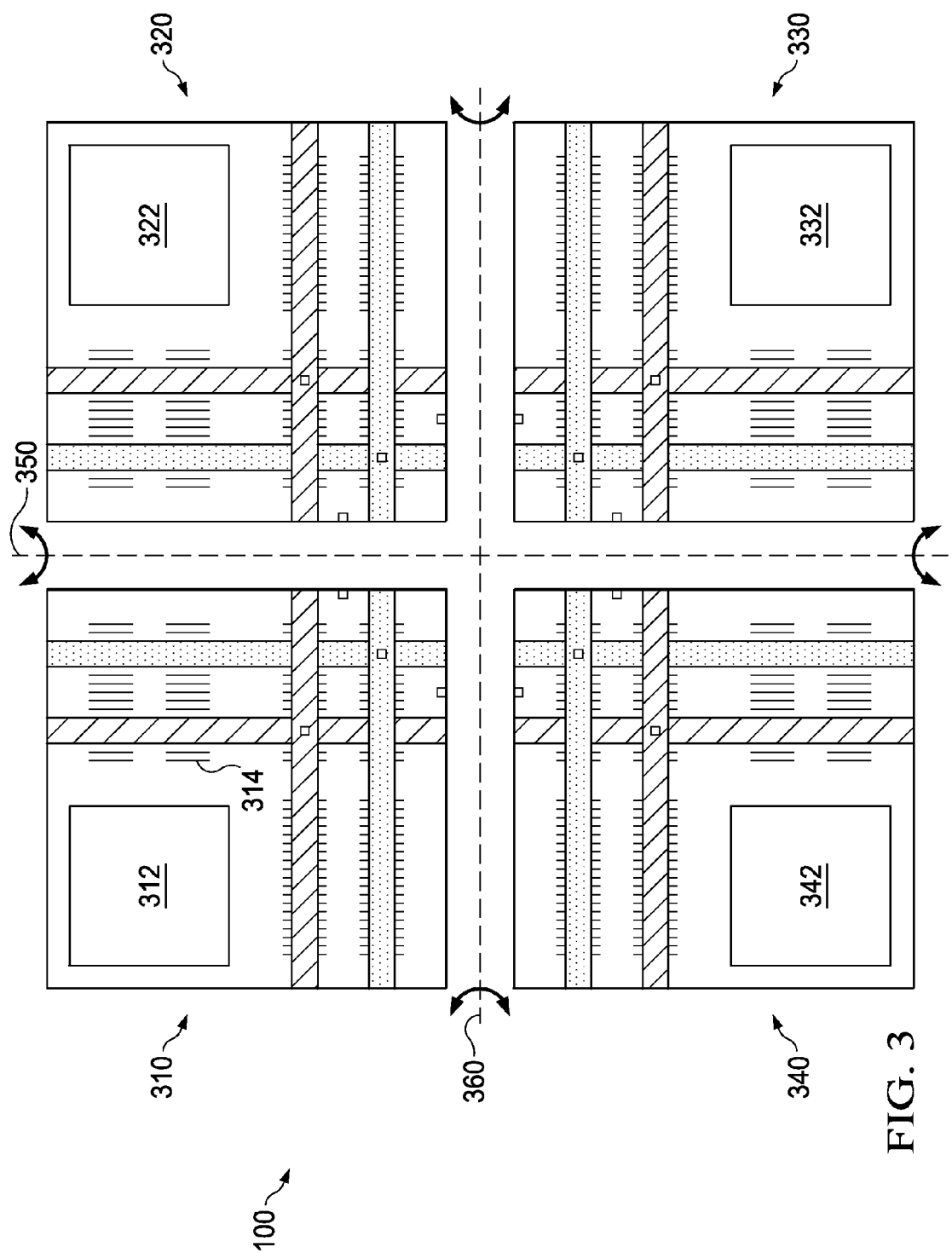
FIG. 3 illustrates four I/O cells each of which has been manufactured in accordance with the disclosure.

Turning to FIG. 3, illustrated are four I/O cells 310, 320, 330, 340, each of which has been manufactured in accordance with the disclosure. FIG. 3 is being used to illustrate that a single I/O cell design can be used in four different orientations, all of which are acceptable as they do not violate existing transistor gate directionality rules. Take for example I/O cell 310, which includes its bond pad 312 in the upper left hand corner of its I/O layout boundary, as well as its transistors 314 being positioned vertically. As is evident, I/O cell 320 is just a mirror image of I/O cell 310, taken about the line 350. Similarly, I/O cell 340 is just a mirror image of I/O cell 310, taken about the line 360. Likewise, I/O cell 330 is just a mirror image of I/O cell 320, taken about the line 360.

Figure 4:
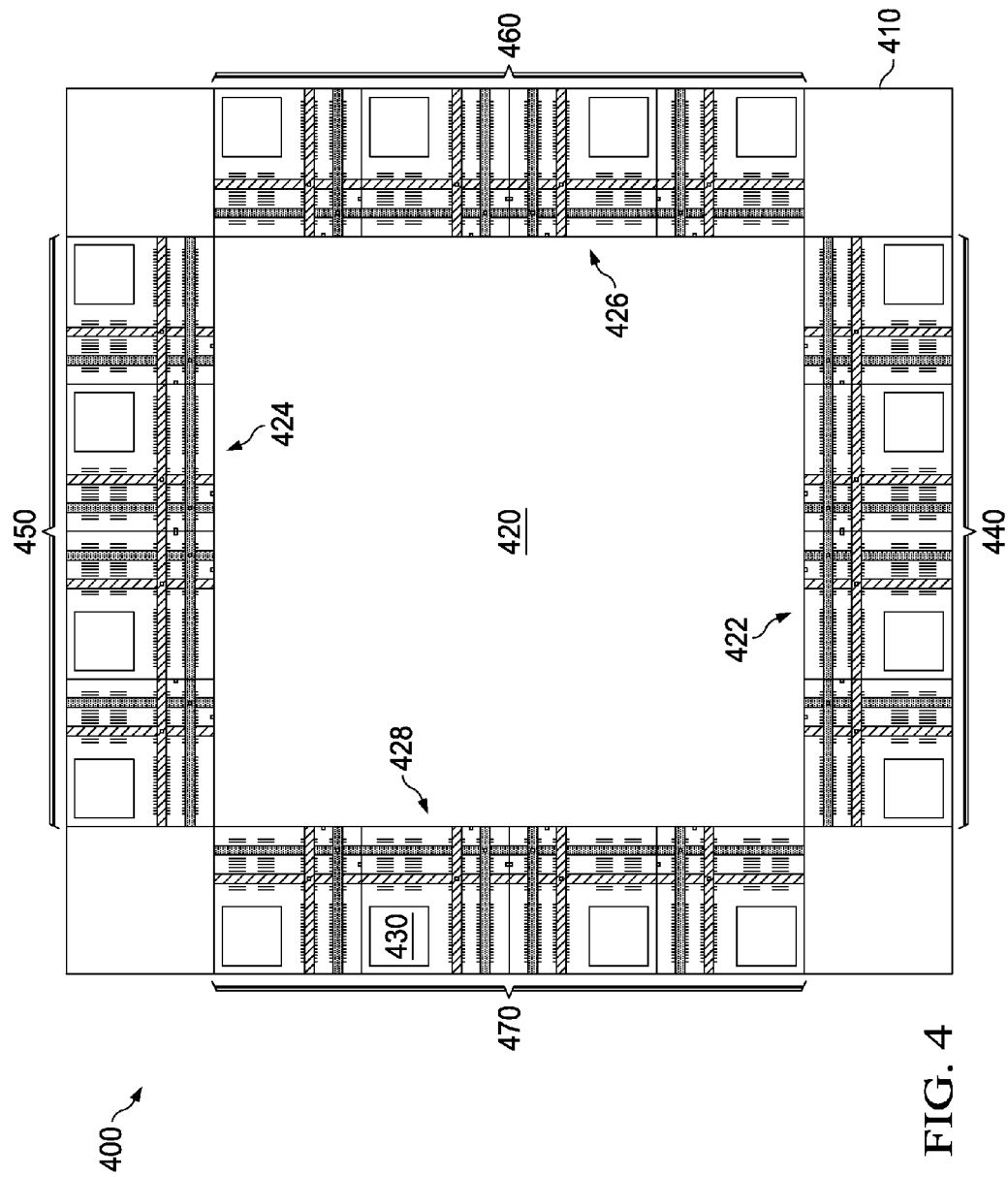
FIG. 4 illustrates an integrated circuit (IC) chip designed and manufactured in accordance with the principles of the disclosure.

Turning to FIG. 4, illustrated is an integrated circuit (IC) chip 400 designed and manufactured in accordance with the principles of the disclosure. The IC chip 400 initially includes a substrate 410. The substrate 410 may be similar to the substrate 110 illustrated in FIG. 1. Delineated on the substrate 110 is a core logic layout boundary 420, in this embodiment including a first side 422, a second opposing side 424, a third side 426 and a fourth opposing side 428. The core logic layout boundary 420, in accordance with the disclosure, includes core logic circuitry (not shown) located therein and over the substrate 410. As the core logic circuitry is well known in the art, no further discussion regarding the same is needed.

As discussed above with regard to the I/O boundary of FIG. 1, the core logic layout boundary 420 can include either an actual or a theoretical boundary encompassing all the features of the core logic circuitry. Accordingly, certain embodiments exist wherein a physical boundary is present separating the core logic circuitry contained within the core logic layout boundary 420 and the devices (e.g., I/O circuitry) surrounding the core logic circuitry. More often than not, however, no boundary exists, as the core logic circuitry and surrounding circuitry (e.g., the I/O circuitry) are formed on a single semiconductor substrate.

The IC chip 400 of FIG. 4 further includes a first 4×1 array 440 of I/O cells 430 along the first side 422 of the core logic layout boundary 420, a second 4×1 array 450 of I/O cells 430 along the second side 424 of the core logic layout boundary 420, a third 1×4 array 460 of I/O cells 430 along the third side 426 of the core logic layout boundary 420, and a fourth 1×4 array 470 of I/O cells 430 along the fourth side 428 of the core logic layout boundary 420. The first, second, third and fourth arrays 440, 450, 460, 470 substantially surround and abut the core logic layout boundary 420.

In accordance with one embodiment of the disclosure, each of the I/O cells 430 includes an I/O layout boundary including bond pads, as well as I/O transistors oriented in the same direction as the other I/O transistors in the first, second, third and fourth arrays 440, 450, 460, 470. Each of the I/O cells 430 additionally includes a first signal pin located proximate a side of the I/O layout boundary abutting the core logic layout boundary 420, as well as a second signal pin located proximate a side of the I/O layout boundary perpendicular the side of the I/O layout boundary abutting the core logic layout boundary 420.

Each of the I/O cells 430 may additionally include first and second power conductors extending entirely between first and second opposing sides thereof and third and fourth opposing sides thereof, respectively. Similarly, each of the I/O cells 430 may include first and second ground conductors extending entirely between first and second opposing sides thereof and third and fourth opposing sides thereof, respectively. When the I/O cells 430 are positioned in the first, second, third and fourth arrays 440, 450, 460, 470 as shown in FIG. 4, associated ones of the power conductors and ground conductors in the adjacent I/O cells 430 contact one another. Accordingly, power and ground conductors, in one embodiment, may extend entirely along the length of the first, second, third and fourth arrays 440, 450, 460, 470.

In the embodiment of FIG. 4, the corners of the IC chip 400 have been left blank. This represents just one embodiment. In another embodiment, the corners of the IC chip 400 are employed with additional bond pads, but without additional I/O transistors. In yet another embodiment, the corners of the IC chip 400 would have I/O cells 430 of their own, in effect providing even more I/O cells per given area of the core logic layout boundary 420.

A fairly specific I/O cell has been described with regard to the embodiment of FIG. 4. Notwithstanding, those skilled in the art understand that other embodiments exist wherein the I/O cell used in the IC chip may differ from that disclosed with regard to FIG. 4. For instance, any I/O cell manufactured in accordance with this disclosure could be used within the IC chip 400 of FIG. 4 without departing from the spirit thereof.

Figure 5:
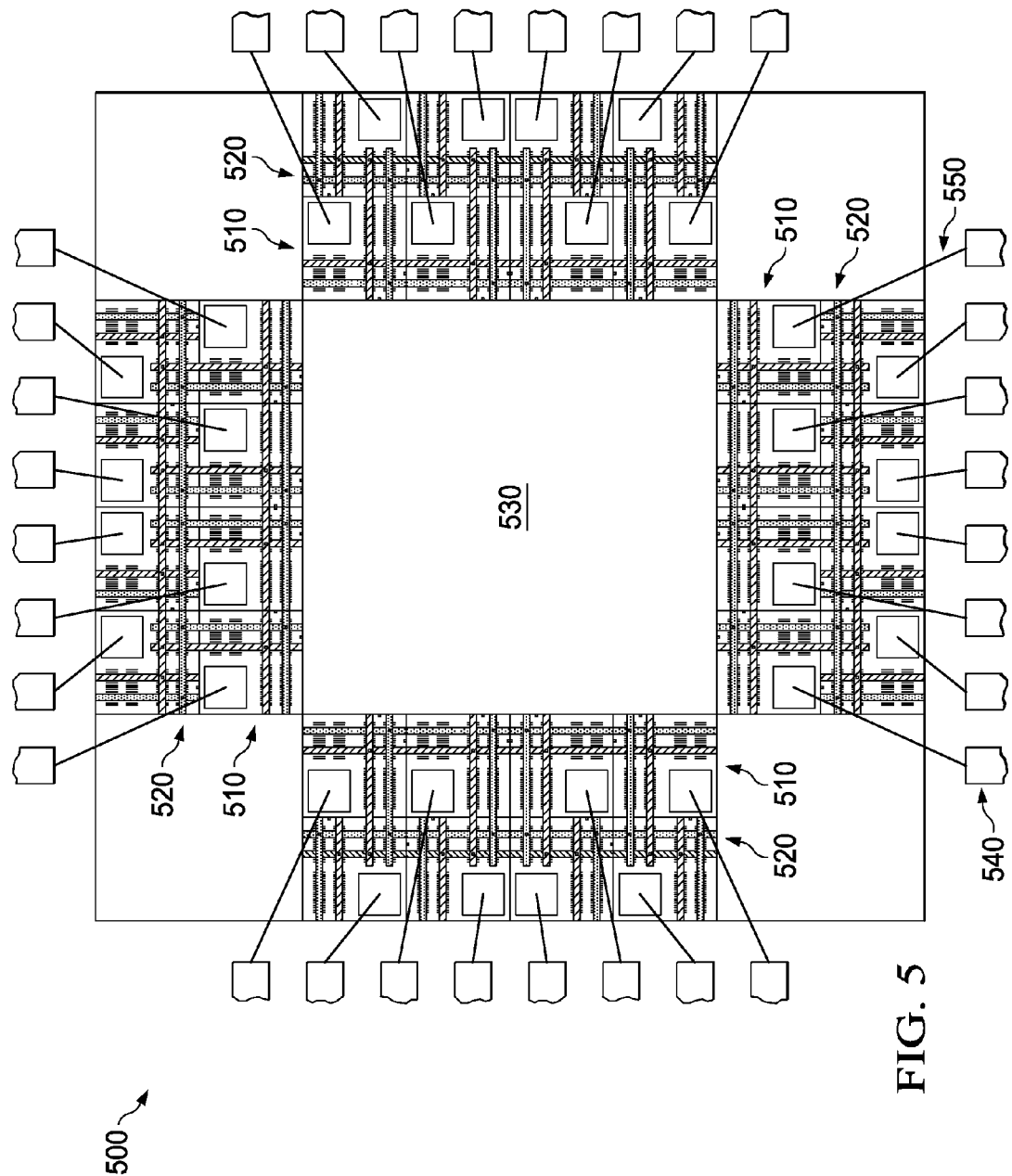
FIG. 5 illustrates an integrated circuit (IC) chip designed and manufactured in accordance with another embodiment of the disclosure.

Turning now to FIG. 5, illustrated is an embodiment of an alternative IC chip 500 design. The IC chip 500 of FIG. 5 is very similar to the IC chip 400 of FIG. 4, with the exception that the IC chip 500 includes a second array of I/O cells 520 surrounding the first array of I/O cells 510. For instance, in the embodiment of FIG. 5 the second array of I/O cells 520 is substantially surrounding the first array of I/O cells 510, and the first array of I/O cells 510 is substantially surrounding the core logic circuitry 530. As one would expect after viewing FIG. 5, this configuration allows for doubling the number of I/O cells associated with the IC chip 500.

The IC chip 500 of FIG. 5 further includes external connections 540, for example lead frame connections, which are coupled to the bond pads of the arrays of I/O cells 510, 520. In the embodiment of FIG. 5, wire bonds 550 couple the external connections 540 and the arrays of I/O cells 510, 520. As is evident in FIG. 5, the positioning of the I/O cells in the first array 510 and second array 520 can be rearranged to improve wire bond spacing, and therefore reduce the likelihood that signals travelling over the different wire bonds 550 will cross.

Those skilled in the art to which this application relates will appreciate that other and further additions, deletions, substitutions and modifications may be made to the described embodiments.

What is claimed is:

1. An integrated circuit chip, comprising:
   core logic circuitry positioned over a substrate and within a core logic layout boundary delineated on the substrate; and
   an array of input/output cells substantially surrounding and abutting the core logic layout boundary, each of the input/output cells including input/output transistors oriented in a same direction as the other input/output transistors in the array, each input/output cell further comprising:
      an input/output layout boundary delineated on the substrate, wherein the input/output layout boundary defines a first side parallel and opposing a second side, a third side parallel and opposing a fourth side, wherein the first and second sides are substantially perpendicular the third and fourth sides;
      first and second power conductors located over the substrate, the first power conductor extending entirely between the first and second sides and the second power conductor extending entirely between the third and fourth sides;
      first and second ground conductors located over the substrate, the first ground conductor extending entirely between the first and second sides and the second ground conductor extending entirely between the third and fourth sides; and a bond pad located within the input/output layout boundary over the substrate.

2. The integrated circuit chip recited in claim 1, wherein each bond pad of each input/output cell is positioned proximate a single corner of its input/output layout boundary, and further wherein at least two edges of each bond pad of each input/output cell are facing the input/output transistors positioned within its input/output layout boundary.

3. The integrated circuit chip recited in claim 1, wherein the input/output layout boundary of each input/output cell in the array forms a square.

4. The integrated circuit chip recited in claim 1, wherein each input/output cell further includes a first signal pin located proximate a side of the input/output layout boundary abutting the core logic layout boundary, and a second signal pin located proximate a side perpendicular the side of the input/output layout boundary abutting the core logic layout boundary.

5. The integrated circuit chip recited in claim 1, wherein the array is a first array, and further including a second array of the input/output cells substantially surrounding an exterior boundary of the first array.

6. The integrated circuit chip recited in claim 1, wherein each bond pad is square.

7. The integrated circuit chip recited in claim 6, wherein two edges of each bond pad face the input/output transistors.

8. The integrated circuit chip recited in claim 6, wherein each bond pad is positioned proximate a corner of the input/output layout boundary.

9. The integrated circuit chip recited in claim 1, wherein the input/output layout boundary of each input/output cell in the array forms a rectangle.

10. The integrated circuit chip recited in claim 1, wherein input/output cells are not located at the corners of the integrated circuit chip.

11. A method for manufacturing an integrated circuit chip, comprising:

positioning core logic circuitry over a substrate and within a core logic layout boundary delineated on the substrate; and forming an array of input/output cells, the array of input/output cells substantially surrounding and abutting the core logic layout boundary, each of the input/output cells including input/output transistors oriented in a same direction as the other input/output transistors in the array, each input/output cell further comprising:

an input/output layout boundary delineated on the substrate, wherein the input/output layout boundary defines a first side parallel and opposing a second side, a third side parallel and opposing a fourth side, wherein the first and second sides are substantially perpendicular the third and fourth sides;

first and second power conductors located over the substrate, the first power conductor extending entirely between the first and second sides and the second power conductor extending entirely between the third and fourth sides;

first and second ground conductors located over the substrate, the first ground conductor extending entirely between the first and second sides and the second ground conductor extending entirely between the third and fourth sides; and a bond pad located within the input/output layout boundary over the substrate.

12. The method recited in claim 11, wherein each bond pad of each input/output cell is positioned proximate a single corner of its input/output layout boundary, and further wherein at least two edges of each bond pad of each input/output cell are facing the input/output transistors positioned within its input/output layout boundary.

13. The method recited in claim 11, wherein the input/output layout boundary of each input/output cell in the array forms a square.

14. The method recited in claim 11, wherein each input/output cell further includes a first signal pin located proximate a side of the input/output layout boundary abutting the core logic layout boundary, and a second signal pin located proximate a side perpendicular the side of the input/output layout boundary abutting the core logic layout boundary.

15. The method recited in claim 11, wherein the array is a first array, and further including a second array of the input/output cells substantially surrounding an exterior boundary of the first array.

16. The method recited in claim 11, wherein each bond pad is square.

17. The method recited in claim 16, wherein two edges of each bond pad face the input/output transistors.

18. The method recited in claim 16, wherein each bond pad is positioned proximate a corner of the input/output layout boundary.

19. The method recited in claim 11, wherein the input/output layout boundary of each input/output cell in the array forms a rectangle.

20. The method recited in claim 11, wherein input/output cells are not located at the corners of the integrated circuit chip.

* * * * *